United States Patent
Yang

(10) Patent No.: US 11,070,181 B2
(45) Date of Patent: Jul. 20, 2021

(54) PUSH-PULL OUTPUT DRIVER AND OPERATIONAL AMPLIFIER USING SAME

(71) Applicant: MACRONIX INTERNATIONAL CO., LTD., Hsinchu (TW)

(72) Inventor: Yih-Shan Yang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 76 days.

(21) Appl. No.: 16/432,536

(22) Filed: Jun. 5, 2019

(65) Prior Publication Data

US 2020/0162043 A1 May 21, 2020

Related U.S. Application Data

(60) Provisional application No. 62/769,571, filed on Nov. 20, 2018.

(51) Int. Cl.
*H03F 3/26* (2006.01)
*H03F 3/45* (2006.01)
*H03K 3/356* (2006.01)
*H03K 3/26* (2006.01)

(52) U.S. Cl.
CPC ..... *H03F 3/45632* (2013.01); *H03F 3/45174* (2013.01); *H03F 3/45273* (2013.01); *H03F 3/45484* (2013.01); *H03K 3/26* (2013.01); *H03K 3/356034* (2013.01)

(58) Field of Classification Search
CPC ... H03F 3/26; H03F 3/265; H03F 3/30; H03F 3/3001; H03F 3/45
USPC .......................... 330/255, 262, 269; 327/333
See application file for complete search history.

(56) References Cited

U.S. PATENT DOCUMENTS

| 2,943,266 | A | | 6/1960 | Belland |
|---|---|---|---|---|
| 3,506,851 | A | | 4/1970 | Polkinghorn et al. |
| 4,442,409 | A | * | 4/1984 | Preslar .................. H03F 3/3096 330/255 |
| 4,570,128 | A | * | 2/1986 | Monticelli ............ H03F 3/3067 330/264 |
| 5,939,944 | A | * | 8/1999 | Gibson ................. H03F 3/3088 330/255 |
| 6,107,882 | A | | 8/2000 | Gabara et al. |

(Continued)

FOREIGN PATENT DOCUMENTS

TW I241064 B 10/2005

OTHER PUBLICATIONS

"Operational Amplifier," Wikipedia definition, downloaded Jan. 30, 2019, 23 pages.

*Primary Examiner* — Steven J Mottola
(74) *Attorney, Agent, or Firm* — Haynes Beffel & Wolfeld LLP

(57) ABSTRACT

A voltage driver circuit for an output stage of an operational amplifier, or other circuits, includes a level shifter and an output driver including a source follower and a common source amplifier in a push-pull configuration. The level shifter generates a node voltage as a function of an input voltage on the input node. The output driver including a first transistor having a control terminal receiving the node voltage, and connected between a supply voltage and an output node, and a second transistor having a control terminal receiving the input voltage from the input node, and connected between the output node and a reference voltage, wherein the first and second transistors have a common conductivity type.

18 Claims, 4 Drawing Sheets

(56) References Cited

U.S. PATENT DOCUMENTS

| | | | |
|---|---|---|---|
| 6,150,853 A * | 11/2000 | Chrappan | H03F 1/3217 |
| | | | 327/108 |
| 6,384,685 B1 * | 5/2002 | Juang | H03F 3/3023 |
| | | | 330/255 |
| 7,271,630 B2 | 9/2007 | Su | |
| 7,724,088 B2 | 5/2010 | Adachi | |
| 2004/0207434 A1 | 10/2004 | Miura | |
| 2009/0066416 A1 | 3/2009 | Adachi | |
| 2018/0159485 A1 | 6/2018 | Yang et al. | |

* cited by examiner

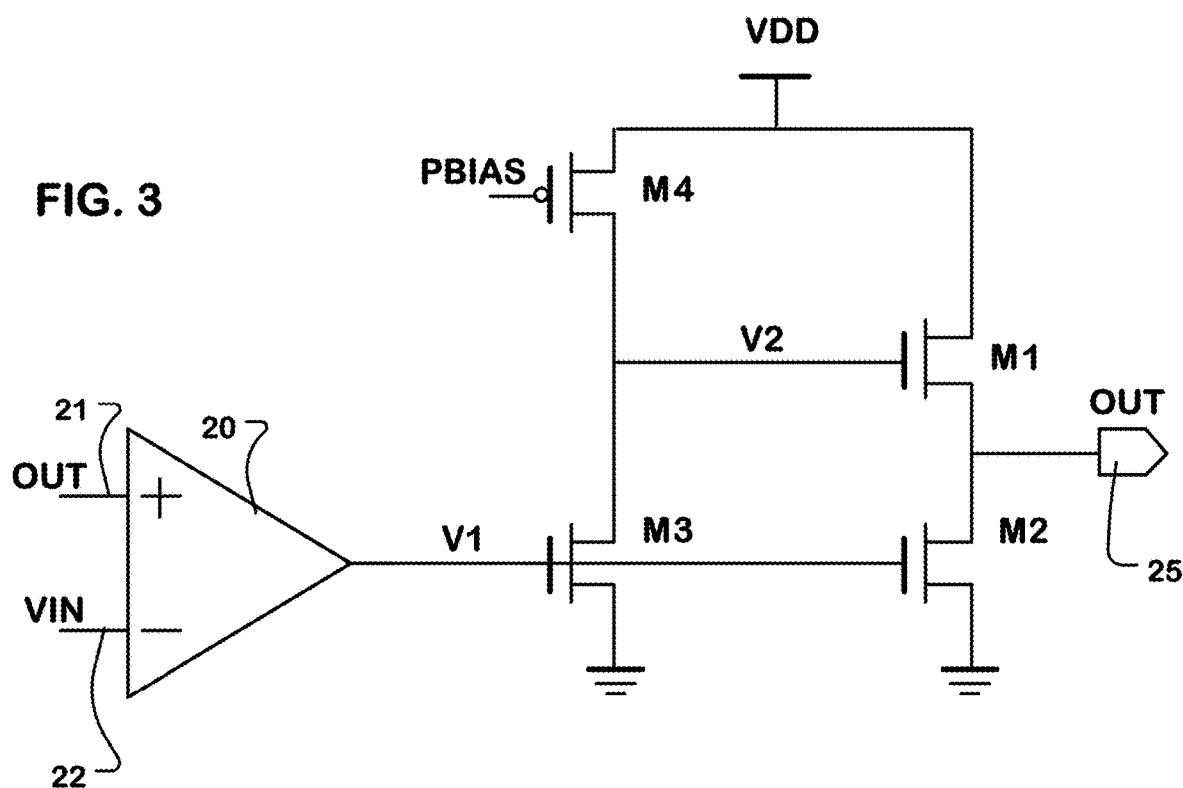
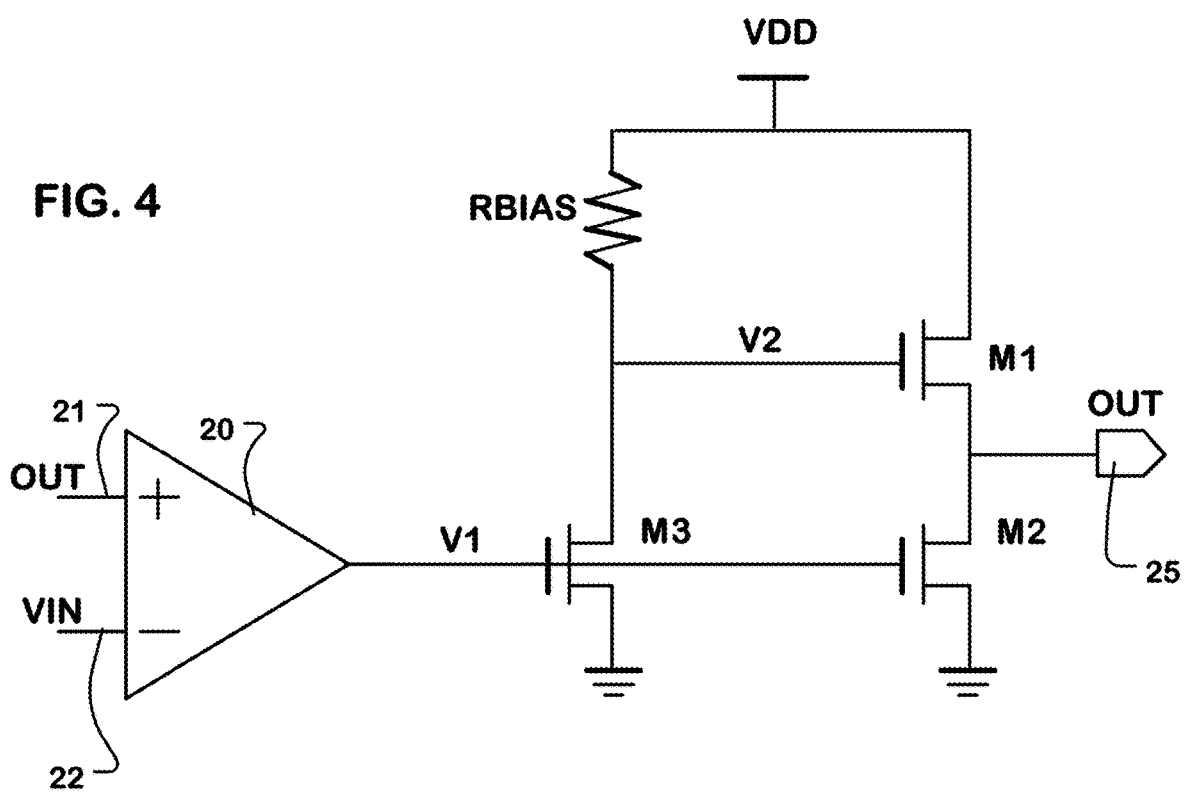

PUSH-PULL OUTPUT DRIVER AND OPERATIONAL AMPLIFIER USING SAME

PRIORITY APPLICATION

This application claims the benefit of U.S. Provisional Patent Application No. 62/769,571 filed 20 Nov. 2018; which application is incorporated herein by reference.

BACKGROUND

Field

The present invention relates to push-pull voltage drivers and operational amplifiers, including such circuits as used in integrated circuits.

Description of Related Art

Operational amplifiers are widely used components in integrated circuits. One characteristic of an operational amplifier is a high power, low impedance, output driver. The output drivers used in operational amplifiers are often configured in a push-pull arrangement to provide quick adjustment of the output voltages.

Conventional output drivers, however, can suffer variations in performance that depend on external factors like Process, Supply Voltage and Temperature (PVT conditions). For example, steady state current consumption can vary from one instance of a circuit to another as a result of varying PVT conditions.

It is desirable to provide a push-pull voltage driver, and an operational amplifier utilizing the same, that can provide better immunity from varying PVT conditions. Also, it is desirable to provide such circuits that can have reduced steady state current consumption.

SUMMARY

A voltage driver circuit is described, suitable for use as an output driver of an operational amplifier, and in other settings. The voltage driver circuit includes a level shifter having an input node, which generates a node voltage as a function of an input voltage on the input node. An output driver includes a first transistor, connected between a supply voltage and an output node, having a control terminal (e.g. gate or base) receiving the node voltage. The output driver also includes a second transistor having a control terminal connected to the input node. The second transistor is connected between the output node and a reference voltage. The second transistor can be connected to a transistor in the level shifter in a current mirror configuration. The first and second transistors have the same conductivity type (e.g., n-type or p-type).

In an embodiment described herein, the first transistor is configured as a source follower, and the second transistor is configured as a common source amplifier.

The voltage driver can have well-controlled steady state DC output.

The voltage driver can be implemented using field effect transistors (NMOS, PMOS) and using bipolar transistors (NPN, PNP).

An operational amplifier is described, in which the input of the voltage driver circuit is connected at the output of an input stage of the operational amplifier. The input stage can comprise, for example, a differential amplifier.

Other aspects and advantages of the present invention can be seen on review of the drawings, the detailed description and the claims, which follow.

BRIEF DESCRIPTION OF THE DRAWINGS

FIG. 3 illustrates a circuit like that of FIG. 2, with a first embodiment of a bias current generator.

FIG. 4 illustrates a circuit like that of FIG. 2, with a second embodiment of a bias current generator.

DETAILED DESCRIPTION

A detailed description of embodiments of the present invention is provided with reference to the FIGS. 1-7.

Figure 1:
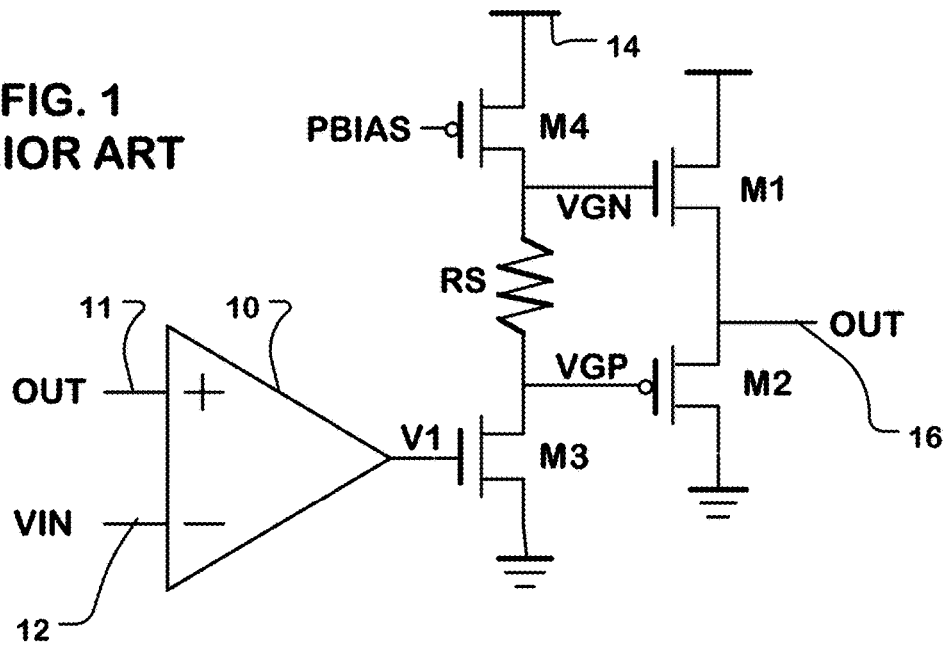
FIG. 1 illustrates a conventional push-pull output stage in an operational amplifier.

FIG. 1 shows an operational amplifier with a conventional push-pull output driver. The circuit includes an input stage comprising a differential amplifier 10 having a first input 11 and a second input 12. An output of the differential amplifier 10 is a node voltage V1 applied as an input to the push-pull output driver. The input of the push-pull output drive is the gate of transistor M3. In this example, the output OUT on node 16 is provided as feedback to input 11, forming a unity gain amplifier.

The output driver includes a first leg comprising PMOS transistor M4, a resistor RS and NMOS transistor M3 in series between a supply voltage node 14 and reference voltage (ground symbol). The reference voltage can be a DC ground. In other embodiments the reference voltage can be AC ground or other DC voltage reference offset from the supply voltage node 14.

PMOS transistor M4 has a gate connected to a bias voltage PBIAS. Nodes on opposing sides of the resistor RS, providing the voltages VGN and VGP, are connected to the gates of transistors M1 and M2 in a push-pull output stage of the driver.

Transistor M1 is an NMOS driven by the voltage VGN, providing a pull-up current. Transistor M2 is a PMOS driven by the voltage VGP, providing a pull-down current.

In operation, the PMOS transistor M4 provides a DC current for the current path including transistor M4, resistor RS and transistor M3. The resistor RS generates a voltage shift from VGN to VGP to bias the transistors M1 and M2 in the output stage. As VIN on the input 12 of the differential amplifier 10 changes, the voltage V1 also changes to drive the output voltage OUT to a level that matches VIN.

As V1 goes up, VGP and VGN likewise shift upward providing higher driving strength to NMOS transistor M1 and weaker driving strength to PMOS transistor M2, which causes the voltage OUT to increase. As V1 goes down, the opposite effect occurs.

In the circuit of FIG. 1, at steady-state, the bias current in the transistors M1 and M2 is hard to control because, although the feedback tends to force equal current in the transistors, the magnitude of that DC current varies according to PVT conditions.

Figure 2:
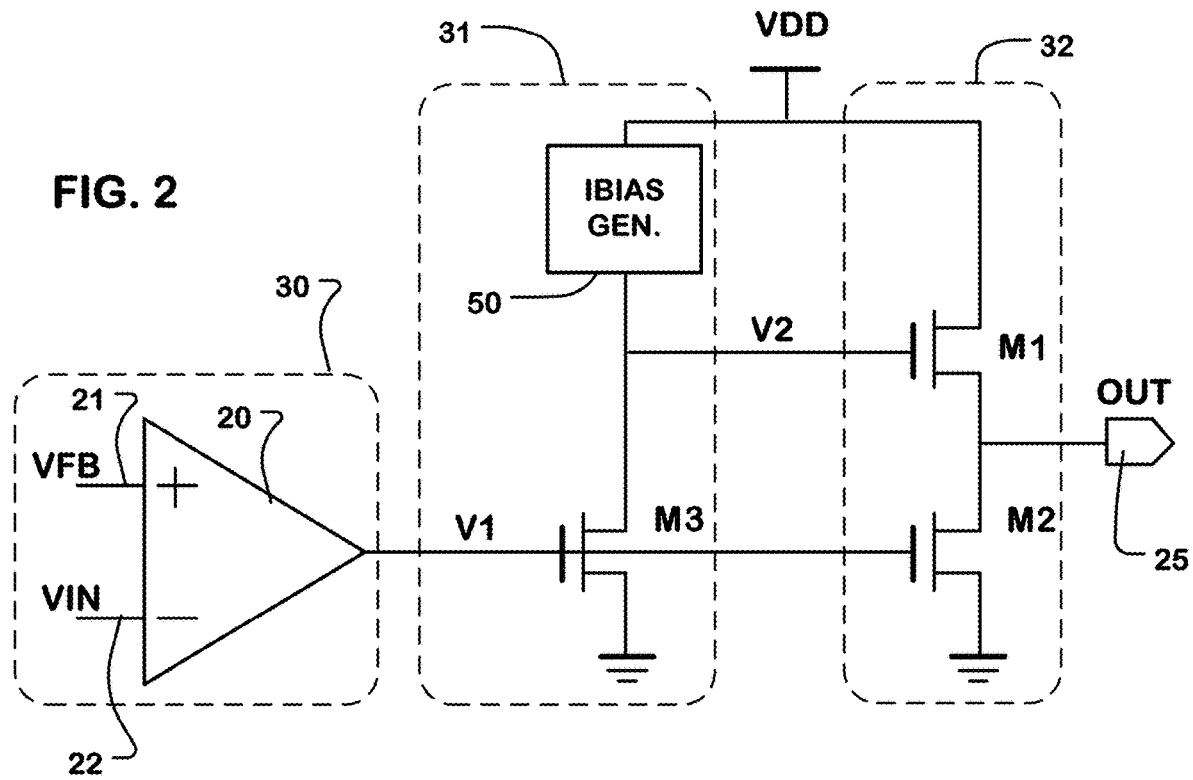
FIG. 2 provides a simplified diagram of an operational amplifier including a push-pull output stage as described herein, implemented using NMOS field effect transistors.

FIG. 2 illustrates an operational amplifier with an improved output driver as described herein. The operational amplifier includes an input stage 30, and a voltage driver circuit including a level shifter 31 and a push-pull output stage 32. In this example, the input stage includes a differential amplifier 20, having a first input 21 coupled to a feedback voltage VFB, which can be generated in feedback from an output node 25 of the output stage 32. In a unity gain configuration, VFB is equal to OUT. The differential amplifier 20 has a second input 22 connected to an input voltage VIN. Differential amplifier 20 provides a voltage V1 on its output in response to the voltages on its inputs. The voltage V1 is referred to as a first node voltage in the description of the operational amplifier. It is the input voltage for the voltage driver circuit.

The level shifter 31 includes a bias current generator 50 which applies a bias current to an NMOS transistor M3. The NMOS transistor M3 has a gate connected to the output of the differential amplifier 20, receiving a voltage V1. The NMOS transistor M3 generates a second node voltage V2 on its drain as a result of fluctuations in the voltage V1 and the current from the bias current generator 50.

The output stage 32 includes NMOS transistor M1 and NMOS transistor M2 in series between the supply voltage VDD and ground or other reference node. As can be seen, the transistors M1 and M2 have the same conductivity type (n-type). Also, the transistor M3 is the same conductivity type as transistors M1 and M2.

The output voltage OUT is generated at the node 25 at the source of M1 and the drain of M2. The gate of transistor M1 is connected to receive the voltage V2. The gate of the transistor M2 is connected to receive the voltage V1.

Transistor M2 is connected in a current mirror configuration with transistor M3, and configured as a common source amplifier.

Transistor M1 is connected in a source follower configuration, and provides strong pull-up current when VFB<VIN as the voltage V2 increases. (As mentioned above, VFB can be equal to OUT for a unity gain configuration).

Transistor M2 provides strong pull-down capability when VFB>VIN as the current mirror effect can maintain substantial current in the output stage even as V1 and V2 tend to fall.

The DC output current is maintained during steady-state by the current mirror configuration with the level shifter 31. As long as the bias current generator 50 produces a constant current well controlled under PVT variations, then the output current in the output stage can also be well controlled.

FIG. 3 illustrates a circuit like that of FIG. 2, with the same reference numerals for like components. In this example, the bias current generator 50 of FIG. 2 is implemented using PMOS transistor M4, having a bias voltage PBIAS applied to its gate. The bias voltage PBIAS can be generated in a manner to provide immunity from PVT variation. Transistor M4 can be configured as a current mirror to provide a constant current. PBIAS can be generated by a current reference circuit, a bandgap reference circuit, another current mirror or other types of bias circuits.

FIG. 4 illustrates a circuit like that of FIG. 2, with the same reference numerals for like components. In this example, the bias current generator 50 of FIG. 2 is implemented using a passive resistor RBIAS. In this case, fluctuations in the supply voltage VDD may be reflected in operation of the circuit. However, the supply voltage VDD can be regulated in some embodiments to provide immunity from PVT variations.

Other types of bias current generators can be utilized with greater or lesser degree of immunity from PVT variation.

Figure 5:
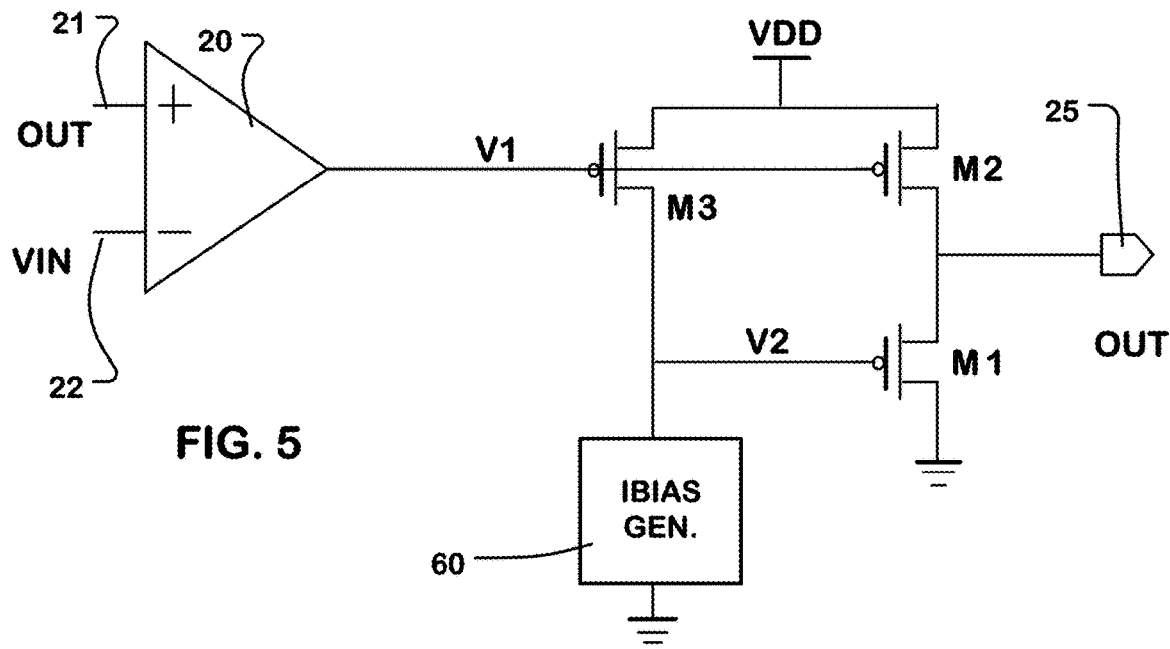
FIG. 5 is a simplified diagram of an operational amplifier including a push-pull output stage as described herein, implemented using PMOS field effect transistors.

FIGS. 2-4 illustrate embodiments in which the transistors M1, M2 and M3 are NMOS transistors. FIG. 5 illustrates an embodiment implemented using PMOS (p-type conductivity).

In the circuit of FIG. 5, the level shifter generates a voltage V2 that is lower than the voltage V1 at the input of the output driver. PMOS transistor M3 has a source coupled to the supply voltage node VDD and a drain connected to the bias current generator 60. The output stage includes PMOS transistors M1 and M2. Transistor M1 connected between the ground reference node and the output node 25. The transistor M2 is connected between the output node 25 and the supply voltage node VDD.

Figure 6:
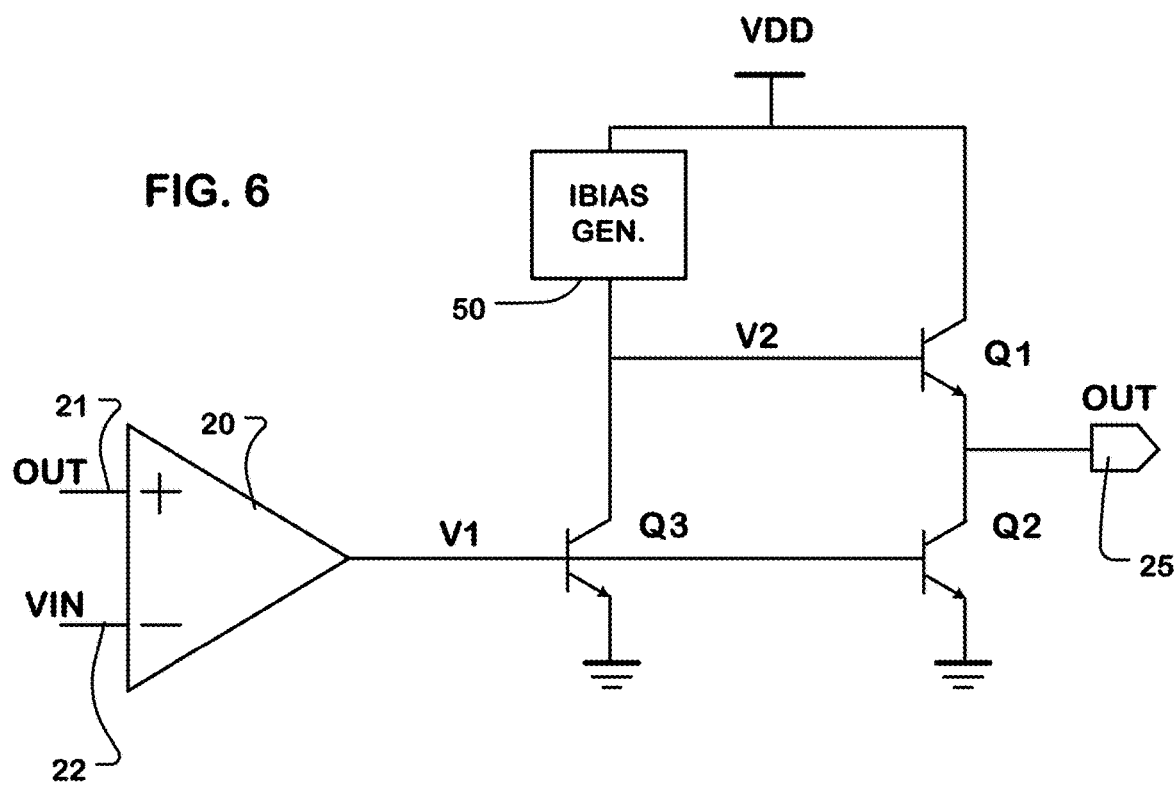
FIG. 6 is a simplified diagram of an operational amplifier including a push-pull output stage as described herein, implemented using NPN bipolar transistors.

FIG. 6 illustrates an embodiment implemented using NPN bipolar transistors (n-type conductivity). The circuit arrangement of FIG. 6 is like that of FIG. 2, with the NMOS transistors M1, M2 and M3 replaced by NPN transistors Q1, Q2 and Q3, respectively.

Figure 7:
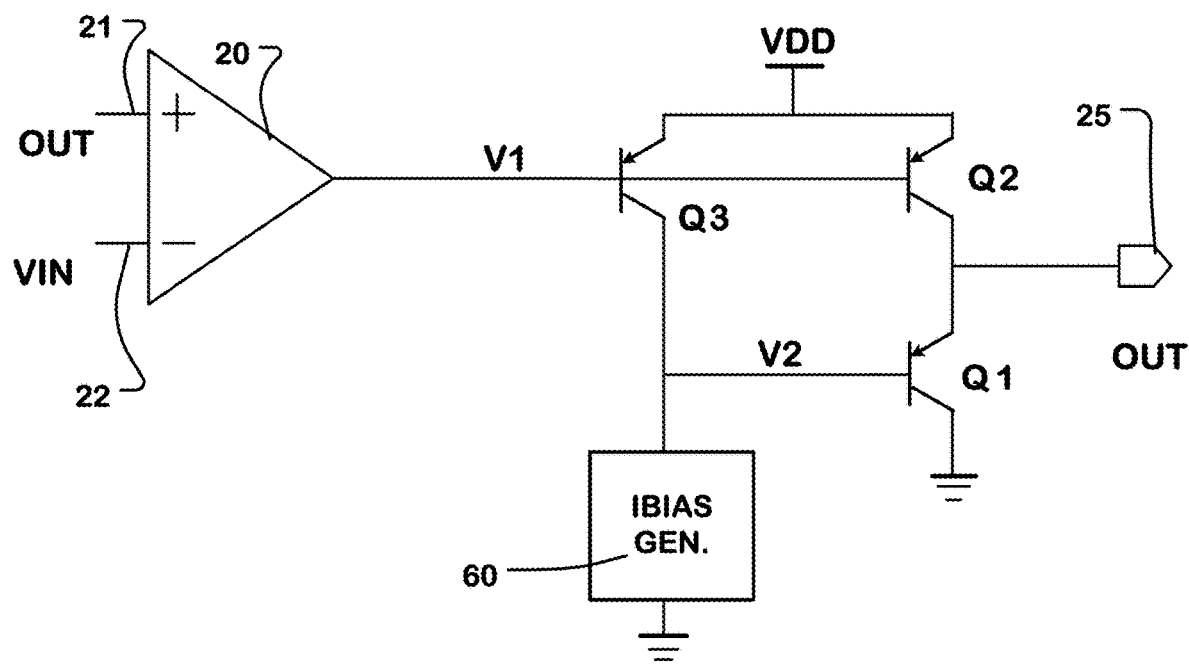
FIG. 7 is a simplified diagram of an operational amplifier including a push-pull output stage as described herein, implemented using PNP bipolar transistors.

FIG. 7 illustrates an embodiment implemented using PNP bipolar transistors (p-type conductivity). The circuit arrangement of FIG. 7 is like that of FIG. 5, with the PMOS transistors M1, M2 and M3 replaced by PNP transistors Q1, Q2 and Q3, respectively.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A voltage driver circuit, comprising:
a level shifter having an input node, which generates a node voltage as a function of an input voltage on the input node; and
an output driver including a first transistor having a control terminal receiving the node voltage, and connected between a supply voltage and an output node, and a second transistor having a control terminal receiving the input voltage from the input node, and connected between the output node and a reference voltage, wherein the first and second transistors have a common conductivity type; wherein the level shifter includes a bias current source and a third transistor connected in series between the supply voltage and the reference voltage, the third transistor having a control terminal receiving the input voltage from the input node.

2. The circuit of claim 1, wherein the first and second transistors are field effect transistors.

3. The circuit of claim 1, wherein the first transistor is configured as a source follower, and the second transistor is configured as a common source amplifier.

4. The circuit of claim 1, wherein the third transistor has a current carrying node at which the node voltage is generated.

5. The circuit of claim 1, wherein the first, second and third transistors are field effect transistors.

6. The circuit of claim 1, wherein the first transistor is configured as a source follower, and the second transistor is configured in current mirror configuration with the third transistor.

7. The circuit of claim 1, wherein the bias current source comprises a fourth transistor in series between the supply voltage and the third transistor, having a conductivity type different than the third transistor.

8. The circuit of claim 1, wherein the first and second transistors are bipolar transistors.

9. The circuit of claim 1, wherein the first and second transistors are bipolar transistors; and
the first transistor is configured as an emitter follower, and the second transistor is configured in current mirror configuration with the third transistor.

10. An operational amplifier circuit, comprising:
an input stage having first and second inputs, which generates a first node voltage at a first circuit node as a function of voltages on the first and second inputs;
a level shifter connected to the first circuit node, which generates a second node voltage on a second circuit node as a function of the first node voltage; and
an output driver including a first transistor having a control terminal receiving the second node voltage, and connected between a supply voltage and an output node, and a second transistor having a control terminal receiving the first node voltage from the first circuit node, and connected between the output node and a reference voltage, wherein the first and second transistors have a common conductivity type; wherein the level shifter includes a bias current source and a third transistor connected in series between the supply voltage and the reference voltage, the third transistor having a control terminal receiving the first node voltage from the first circuit node.

11. The circuit of claim 10, wherein the first and second transistors are field effect transistors.

12. The circuit of claim 10, wherein the first transistor is configured as a source follower, and the second transistor is configured as a common source amplifier.

13. The circuit of claim 10, wherein the bias current source comprises a fourth transistor in series between the supply voltage and the third transistor, having a conductivity type different than the third transistor.

14. The circuit of claim 10, wherein the third transistor has a current carrying node connected to the second circuit node, and to the bias current source.

15. The circuit of claim 10, wherein the first transistor is configured as a source follower, and the second transistor is configured in current mirror configuration with the third transistor.

16. The circuit of claim 10, wherein the first and second transistors are bipolar transistors; and
the first transistor is configured as an emitter follower, and the second transistor is configured in current mirror configuration with the third transistor.

17. The circuit of claim 10, wherein the input stage comprises a differential amplifier.

18. An operational amplifier circuit, comprising:
a differential amplifier having first and second inputs, which generates a first node voltage at a first circuit node as a function of voltages on the first and second inputs;
a level shifter connected to the first circuit node, includes a bias current source and a third transistor connected in series between a supply voltage and a reference voltage, the third transistor having a gate receiving the first node voltage from the first circuit node and a drain at which a second node voltage is generated; and
an output driver including a first transistor having a gate receiving the second node voltage, and connected between the supply voltage and an output node, and a second transistor having a gate receiving the first node voltage from the first circuit node, and connected between the output node and the reference voltage, wherein the first and second transistors have a common conductivity type, wherein the first transistor is configured as a source follower, and the second transistor is configured as a common source amplifier.

* * * * *